United States Patent [19]

Denison et al.

[11] Patent Number: 5,124,649

[45] Date of Patent: Jun. 23, 1992

[54] MAGNETIC RESONANCE IMAGING WITH SELECTIVE PHASE ENCODING AVERAGING

[75] Inventors: Kenneth S. Denison, Shaker Hts.; G. Neil Holland, Chagrin Falls; E. Mark Haacke, University Hts.; John L. Patrick, Euclid, all of Ohio

[73] Assignee: Picker International, Inc., Highland Hts., Ohio

[21] Appl. No.: 56,817

[22] Filed: Jun. 2, 1987

[51] Int. Cl.⁵ .............................................. G01R 33/20
[52] U.S. Cl. .................................................. 324/309
[58] Field of Search ............... 324/307, 309, 311, 312; 128/653

[56] References Cited

U.S. PATENT DOCUMENTS

| | | | |
|---|---|---|---|
| 4,431,968 | 2/1984 | Edelstein et al. | 324/309 |
| 4,516,075 | 5/1985 | Moran | 324/309 |
| 4,516,582 | 5/1985 | Redington | 128/653 |
| 4,570,119 | 2/1986 | Wehrli et al. | 324/306 |
| 4,683,431 | 7/1987 | Pattany et al. | 324/306 |
| 4,684,891 | 8/1987 | Feinberg | 324/309 |
| 4,689,560 | 8/1987 | Nayle et al. | 324/306 |
| 4,740,749 | 4/1988 | Yamamoto et al. | 324/312 |

FOREIGN PATENT DOCUMENTS 0142343 5/1985 European Pat. Off. .
2127155 4/1984 United Kingdom .

OTHER PUBLICATIONS

"Detection of Hepatic Metastases: Analysis of Pulse Sequence Performance in MR Imaging" by Stark, et al., Radiology, May 1986, pp. 365-370.
"NMR Blood flow imaging using multiecho, phase contrast sequences" by O'Donnell, Med. Phys. 12(1) Jan./Feb. 1985, pp. 59-64.
"Pulsed Field-Gradient Spin Echo NMR Studies of Flow In Fluids" by Hayward, et al., Molecular Physics, 1972, vol. 23, No. 6, pp. 1083-1102.
"Blood Flow: Magnetic Resonance Imaging" by Bradley, et al. Radiology, vol. 154, No. 2, Feb. 1985.
"NMR Even Echo Rephasing in Slow Laminar Flow" by Waluch, et al. Jour. of Computer Assisted Topography, Aug. 1984, vol. 8, No. 4, pp. 594-598.
"Study of Slow Coherent Molecular Motion by Pulsed Nuclear Magnetic Resonance" by Packer, Molecular Physics., vol. 17, No. 4, 1969, pp. 355-368.
"Measurement of Flow with NMR Imaging Using a Gradient Pulse and Phase Difference" by Bryant, et al. J. of Comp. Assist. Tomo. vol. 84, No. 4, pp. 588-593, 1984.
"A New Method of NMR Flow Imaging" Letters to the Editor, Phys. Med. Biol., 1984, vol. 29, No. 7, 891-835.
"A Flow Velocity Zeugmatographic Interlace for NMR Imaging in Humans" by Moran, Mag. Res. Imaging, vol. 1, pp. 197-203, 1982.

Primary Examiner—Michael J. Tokar
Attorney, Agent, or Firm—Fay, Sharpe, Beall, Fagan, Minnich & McKee

[57] ABSTRACT

A gradient magnetic field control (20) and a transmitter (30) are operated under the control of a timing and control computer (40) to generate magnetic resonance excitation pulse sequences. Each sequence provides phase encoding with one of a plurality of phase angles to the resultant resonance signals. A receiver (34) receives the phase encoded magnetic resonance signals which are digitized by an analog to digital converter (50) to form a plurality of views which are stored in a view memory (52). A larger plurality of views are generated adjacent a central or zero phase angle, e.g. views −63 to +64 of FIG. 2, and only one or a smaller plurality of views are generated adjacent peripheral phase angles, e.g. views −127 to −64 and +65 to +128 of FIG. 2. The slower, low frequency motion artifacts, such as respiratory motion artifacts, manifest themselves in the low frequency phase encoded views adjacent the zero phase encode angle. Averaging a plurality of views encoded adjacent the zero phase angle attenuates low frequency motion artifacts. The high frequency views adjacent the ±90° phase angles contribute little or nothing to the low frequency motion artifacts. Accordingly, the high frequency views are either uniquely collected or a smaller number are averaged.

15 Claims, 2 Drawing Sheets

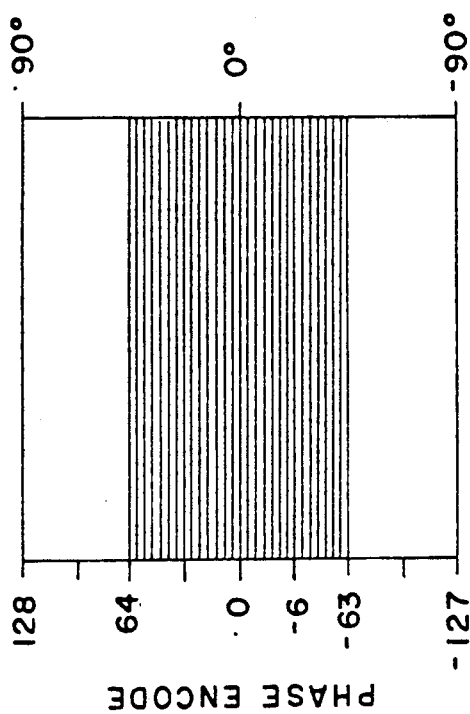
FIG. 3
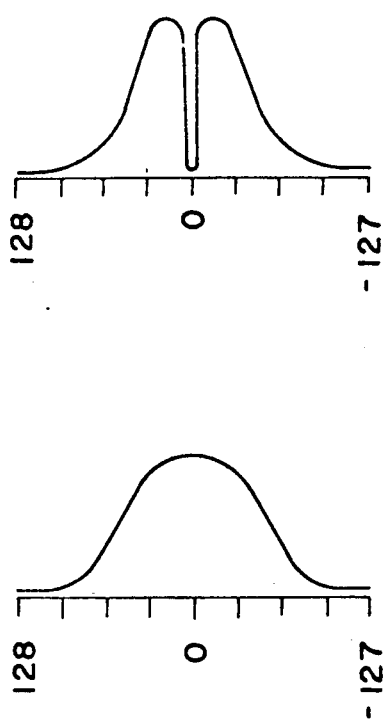
FIG. 7
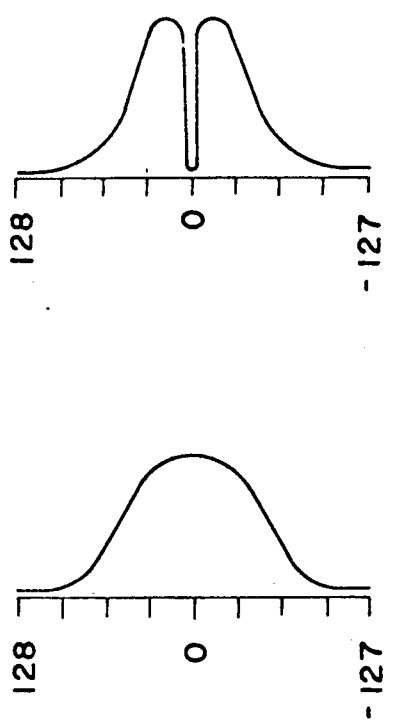
FIG. 6
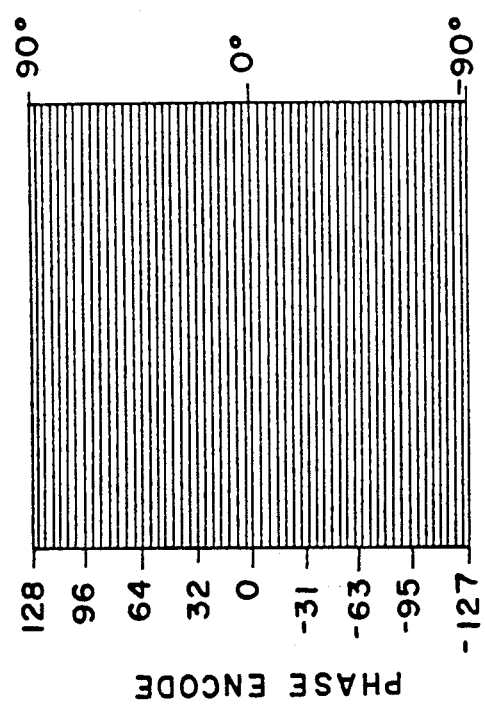
FIG. 2
FIG. 5
FIG. 4

MAGNETIC RESONANCE IMAGING WITH SELECTIVE PHASE ENCODING AVERAGING

BACKGROUND OF THE INVENTION

The present invention relates to the art of magnetic resonance imaging. It finds particular application in conjunction with motion desensitization of magnetic resonance images and will be described with particular reference thereto. It is to be appreciated, however, that the present invention may also be applicable to other image enhancement, modification, and improvement techniques.

Heretofore, medical diagnostic magnetic resonance imaging has included the sequential pulsing of radio frequency signals and magnetic field gradients across a region to be imaged. In two dimensional imaging, a patient is disposed with a region of interest in a substantially uniform main magnetic field. A slice select gradient is applied across the field to select a slice or other region of the patient to be imaged. A phase encode gradient is applied along one of the axes of the selected slice to encode the material with a selected phase angle along the phase encode axis. In each repetition of the pulse sequences, the phase encode gradient is commonly stepped in regular increments from a first peripheral phase encode angle of $+90°$ in increments through a central phase angle of zero to an opposite peripheral phase angle of about $-90°$. Each repetition of the pulse sequence produces a corresponding set of sampled data points, generally termed a view or step. In this manner, each view is phase encoded with a corresponding one of the phase angle increments. The central or zero phase encoded views provide the contrast in the resultant image; whereas the views phase encoded near the peripheral angles contribute the fine detail or resolution. A frequency encode gradient pulse frequency encodes the material along another axis of the slice, conventionally perpendicular to the phase encode axis.

Various motions during the acquisition of magnetic resonance data degrade the resultant images. The motions may be divided into two groups—rapid motions which transpire within the time to collect one view and slower motions which continue to occur over the collection of several views. The rapid motions tend to degrade fine resolution or detail, but have little effect on contrast. The effects of rapid motions can be reduced using prior art gradient rephasing techniques or the like.

The slower, low frequency motions tend to cause ghosts and other contrast defects without degrading the fine detail. The effects of slower, low frequency motions, such as respiratory or body movement, are commonly reduced by averaging. That is, the set of pulse sequences that produce the set of view used to reconstruct an image is repeated a plurality of times to collect redundant data. The redundant views corresponding to the same phase angle are averaged and the averaged views are utilized to reconstruct the image representation. Heretofore, the same number of redundant views have been collected corresponding to every phase angle. Although the number of redundant views corresponding to each phase angle might be as low as two, larger numbers of views, such as eight, sixteen, or more, are not uncommon.

One of the drawbacks with the prior art view averaging techniques has been the extended scan time. To produce and average two sets of redundant views requires twice the scanning time of collecting a single set. Similarly, averaging eight or sixteen sets of redundant views increases the scan time by a factor of eight or sixteen respectively. Thus, reducing image degradation attributable to slower motions causes a corresponding increase in scan time. Correspondingly, shortening the scan time can be achieved by reducing the number of views averaged, but at the cost of greater sensitivity to slower motion artifacts and degradation.

The present invention provides a new and improved magnetic resonance data processing technique which enables slow or low frequency motion degradation to be reduced without increasing imaging time or, conversely, to reduce imaging time without increasing artifacts from slower motion.

SUMMARY OF THE INVENTION

In accordance with one aspect of the present invention, a set of views suitable for transformation into an image representation is produced. Each view in the set corresponds to each of a plurality of preselected phase encode angles. Redundant views corresponding to some, but not all, of the phase angles are further produced. The redundant views corresponding to the same phase angle are averaged before the views are transformed into an image representation.

In accordance with a more limited aspect of the invention, a plurality of all views in the set are produced. However, a larger plurality of views are produced with the preselected phase angles. In this manner, a larger number of views corresponding to the preselected phase angles are averaged.

In accordance with another more limited aspect of the present invention, imaging sequences with phase angles closest to a central or zero phase angle are repeated a larger number of times. Imaging sequences with phase angles closer to a maximum peripheral phase encode angle are performed only once or a smaller number of times.

In accordance with another aspect of the present invention, slower motions, such as respiration and body movement, have a large effect on the views encoded near the central phase angle and little or no effect on the views encoded near the maximum peripheral phase angles. Redundant views encoded with phase angles near the central phase angle are averaged to reduce slower, low frequency motion degradation. Because the peripheral views are substantially unaffected by slower, low frequency motion, averaging multiples of the peripheral views has little or no effect on low frequency motion.

One advantage of the present invention is that it attenuates slow, lower frequency motion artifacts without increasing the scan time of a standard scan sequence in which each view is redundantly collected the same number of times and averaged.

Another advantage of the present invention is that it reduces image acquisition time with no reduction in motion artifact attenuation.

Still further advantages of the present invention will become apparent to those of ordinary skill in the art upon reading and understanding the following detailed description of the preferred embodiments.

BRIEF DESCRIPTION OF THE DRAWINGS

The invention may take form in various steps and arrangements of steps and in various components and arrangements of components. The drawings are only for purposes of illustrating a preferred embodiment and are not to be construed as limiting the invention.

FIG. 2 is a graphic representation to assist in conceptualizing a 256 view array in which each view is uniquely encoded;

FIG. 3 is a graphic conceptualization to assist in conceptualizing a view array which includes only the 128 views encoded with phase angles adjacent a central or zero phase encode angle;

FIG. 4 is a graphic depiction of a view averaging scheme;

FIG. 5 is a graphic depiction of another view averaging scheme;

FIG. 6 is a graphic depiction of a further alternate view averaging scheme; and

FIG. 7 is a graphic depiction of yet another view averaging scheme.

DETAILED DESCRIPTION OF THE PREFERRED EMBODIMENT

Figure 1:
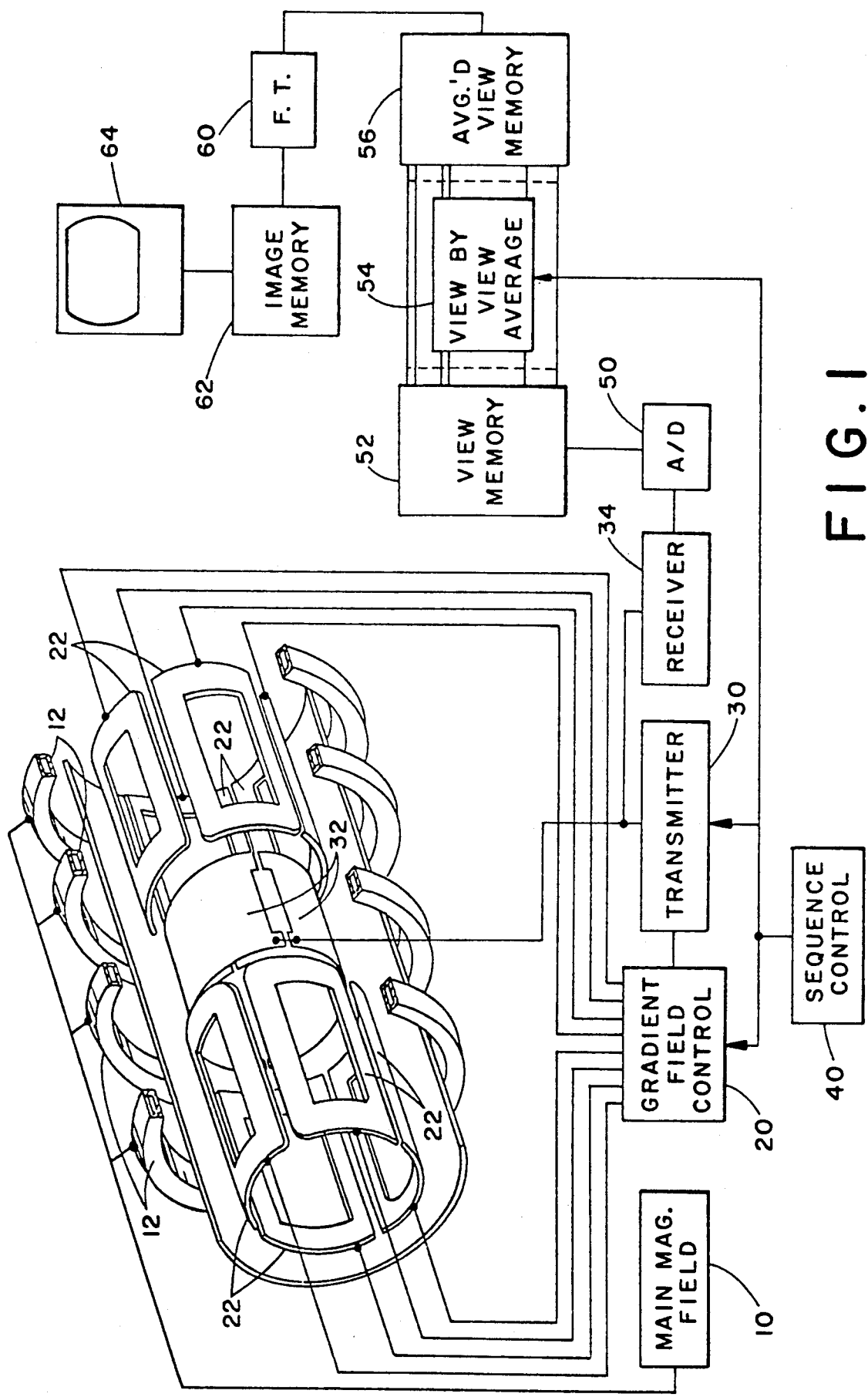
FIG. 1 is a diagrammatic illustration of a magnetic resonance imaging apparatus in accordance with the present invention.

With reference to FIG. 1, a uniform, main magnetic field is generated in a magnetic resonance imaging apparatus by a main magnetic field means including a main magnetic field controller 10 and a plurality of electromagnets 12. A gradient field control means 20 selectively controls the application of gradient fields across the main magnetic field by gradient field coils 22. By selectively applying current pulses to the appropriate gradient field coils, slice select, phase encode, and read gradients are selectively applied along mutually orthogonal axes to define an image slice or other region. A transmitter 30 selectively supplies radio frequency pulses to RF coils 32 to excite magnetic resonance and manipulate the magnetization of resonating dipoles. Magnetic resonance signals generated by the resonating dipoles are received by the RF coil 32 and a receiver 34. A timing and control means 40 controls the timing and application of gradient and radio frequency pulses to perform imaging sequences as are well known in the art.

With continuing reference to FIG. 1 and further reference to FIG. 2, each imaging sequence commonly includes an RF magnetic resonance excitation pulse, one or more slice select gradient pulses, a phase encode gradient pulse, a magnetic resonance inversion or other RF manipulation pulse, and one or more read gradient pulses. Thereafter, a magnetic resonance signal is received by the receiver 34 and digitized by an analog to digital converter 50 to form a view or line of digital data. The full set of views correspond to an image are accumulated and stored in a view memory means 52. Commonly, each view is identified by the phase angle with which the resonance data was encoded by the selected phase encode gradient pulse. The digital data within or along each view or line is commonly frequency encoded by the read gradient pulse.

In each repetition of the resonance imaging sequence, the phase angle is changed in increments. Commonly, the phase angle is stepped in increments from about −90° through 0° to +90°. In a 256 view image data set, a central view with a zero phase encode angle view is generally denoted as the zeroth view. The progressively more peripheral or larger phase angle encoded views to one side of the central view are generally designated as +1 through +128. The views to the other side are generally designated as −1 adjacent the central view to −127 at the peripheral view. In this manner, a total of 256 views including the zeroth view, are produced.

The zeroth or zero phase angle view contributes the lowest frequency components to the resultant image which in turn contribute primarily to the contrast. As the phase angle increases towards the ±90° peripheral views, the corresponding views provide a progressively higher frequency component to the resultant image. The higher the frequency, the finer the resolution that is contributed. The lower the frequency, the greater the contribution to coarser resolution and contrast. Thus, the larger phase angles whether towards the plus or minus 90° contribute primarily to the resolution, whereas the smallest phase angles contribute primarily to the contrast.

In magnetic resonance imaging, high and low frequency motions cause motion artifacts. The higher frequency, rapid motions which occur in a time period shorter than the duration between collecting subsequent images produce high frequency motion artifacts. The high frequency artifacts can be advantageously removed utilizing prior art gradient rephasing techniques. The slower, low frequency motions which continue during the collection of several views produce low frequency artifacts which are commonly removed by averaging.

The low frequency motion affects the corresponding low frequency view(s) collected at the corresponding low phase encode angle(s). Quicker motions primarily affect the intermediate views encoded with the corresponding intermediate phase angles. The most rapid, high frequency motions affect primarily the largest phase angle encoded higher frequency peripheral views. By selectively averaging the affected views, the corresponding motion artifact in the image can be attenuated.

With reference to FIG. 3, respiratory motion provides a low frequency motion artifact which affects primarily the central views, i.e. the views phase encoded with the smallest phase angles. By repeating the resonance excitation sequences and collecting a second set or array of views or lines which correspond only to the central phase angles, redundancy is provided for the lowest frequency, smallest phase angle views. That is, a larger number of views are collected corresponding to the phase angles that are most affected by low frequency motion. The redundant views are also stored in the view memory 52. A view averaging means 54 averages the corresponding stored redundant views. The averaged views and any unique peripheral views are transferred to an averaged view memory 56. That is, either an average or unique view corresponding to each preselected phase encode angle is transferred to the averaged view memory means 54.

In the 256 view embodiment illustrated in FIG. 3, the 128 central views (views −63 to +64 are each the average of two corresponding views and the higher frequency 128 views (views −127 to −64 and +65 to 128 are uniquely collected. A larger plurality of redundant central views may, of course, be collected and averaged. The data set may include more or less than 256 views. For a data set with 2n views, the views would range generally from −n to +n and the center views would range generally from −n/2 to +n/2. However, due to the presence of the zeroth view, either the upper or lower limit is shortened one view, i.e. from −(n−1) to +n or from −n to +(n−1). In the preferred embodiment, the 2n views range from (n−1) to +n and views −(n−1/2) through +n/2 would be redundantly generated and averaged.

A Fourier transforms means 60 performs a dimensional Fourier transform of the set of views in the averaged view memory 56 to form an image representation for storage in an image memory means 62. A typical image may be a 256×256 array of digital pixel values. The image representation may be improved with various known image enhancement techniques and stored or displayed on a video monitor 64 or other display.

With reference to FIG. 4, one might collect each of the more central views eight times and the peripheral views twice. Each of the two corresponding peripheral views would be averaged and each of the corresponding eight central views would be averaged to produce one set or array of views for storage in the averaged view memory 56. It is to be appreciated that collecting the central half of the views eight times and the peripheral half of the view twice can be accomplished in the same duration as taking five complete view sets of data. However, because eight rather than five of the low frequency views are averaged, low frequency motion artifacts are attenuated significantly more. Conversely, collecting eight of the central half of the views and two of the peripheral half of the views can be accomplished in 62½% of the time required to collect eight views and with no significant loss in low frequency motion artifact attenuation.

Of course, the views need not be divided into only two groups. Rather, as illustrated diagrammatically in FIG. 5, the greatest redundancy may be provided in the central most views, significant but less redundancy in the next most central views, less redundancy yet in the next most central views, and the least redundancy in the peripheral most views. As yet another option as illustrated diagrmmatically in FIG. 6, the number of redundant views may vary along a bell curve having its apex at the central most view.

If the motion artifact to be corrected does not correspond to the lowest frequency views, then the degree of redundancy view may be varied accordingly. As illustraed in FIG. 7, relatively little redundancy may be provided for the central and most peripheral views with the most redundancy being provided for intermediate views. Such an arrangement may correct for motion artifacts whose primary contribution comes at the more redundantly collected frequencies or phase encode angles.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiments, we now claim the invention to be:

1. A method of magnetic resonance imaging with reduced slower motion related artifacts, the method comprising:
    a) exciting magnetic resonance in a region of interest, phase encoding the region of interest with a selected phase angle, and collecting and digitizing resultant magnetic resonance signals to generate a view;
    b) repeating step (a) a plurality of times, each repetition of step (a) being performed with one of a plurality of phase angle encodings varying at least between a first peripheral phase angle encoding and a zero phase angle encoding to generate a corresponding plurality of views;
    c) further repeating step (a) a plurality of additional times, each further repetition being performed with one of the selected phase angles which is adjacent the zero phase angle to produce redundant views phase encoded with phase angles adjacent the zero phase angle;
    d) averaging the redundant views which correspond to the same phase angle; and,
    e) transforming the views and averaged views into an image representation.

2. The method as set forth in claim 1 further including repeating steps (b) and (c) a plurality of times such that redundant views are produced encoded with phase angles adjacent the first peripheral phase angle and a larger number of redundant views are produced encoded with phase angles adjacent the zero phase angle which the redundant views corresponding to the same phase angle are averaged and the averaged views are transformed into the image representation.

3. The method as set forth in claim 1 wherein step (b) is repeated with each view being phase encoded with a phase angle varying between the first peripheral phase angle and a second peripheral phase angle.

4. The method as set forth in claim 3 wherein the first peripheral phase angle is about 90°, and the second peripheral phase angle is about −90°.

5. The method as set forth in claim 4 wherein the phase angles of the views vary in n incremental steps between the first peripheral and zero phase angles and in n incremental steps between the zero and the second peripheral phase angle, where n is an integer.

6. The method as set forth in claim 5 wherein step (c) is repeated a plurality of times for views with a phase angle generally between −n/2 and n/2.

7. In a method of magnetic resonance imaging in which views are produced with each of a plurality of phase angle encodings, the improvement comprising:
    producing a larger plurality of views encoded with preselected phase angles than with others of the plurality of phase angles;
    averaging plural views which correspond to the same phase angle.

8. The method as set forth in claim 7 wherein the phase angles with which the views are encoded range from a negative first relatively large phase angle through a zero phase angle to a positive relatively large phase angle and wherein the preselected views are the views that are phase encoded with angles adjacent the zero phase angle.

9. The method as set forth in claim 7 wherein the plurality of views includes 2n views that are phase encoded at phase angle increments ranging from about −n through zero to about +n, where n is an integer; and wherein there is greater redundancy in the views that are phase encoded with phase angles between about −n/2 and +n/2 than views between −n and −n/2 and between about +n and +n/2.

10. The method as set forth in claim 9 wherein at least twice as many views are produced which are phase encoded between about +n/2 and −n/2 than views that are with a phase angle between about n/2 and n and between about −n/2 and −n.

11. An apparatus for generating magnetic resonance images with improved low frequency motion artifact attenuation, the apparatus comprising:

means for generating a substantially uniform main magnetic filed throuhg a region of interest;

gradient magnetic field means for selectively applying phase encode, slice select, and read gradients across the region of interest, the phase encode gradients being selectable to encode each of a plurality of selected phase angles ranging between opposite peripheral phase angles;

a radio frequency transmission means for exciting magnetic resonance in the region of interest;

receiving means for receiving magnetic resonance signals, each magnetic resonance signal being encoded with a selected one of the phase angles;

an analog to digital converter for digitizing each resonance signal to produce a corresponding view;

a view memory means for storing a plurality of views, such that stored views are each phase encoded at one of the plurality of preselected phase angles ranging between the opposite peripheral phase angles;

an imaging sequence control means for selectively controlling the gradient field means and the radio frequency transmission means to cause at least one view to be produced corresponding to each phase angle adjacent the peripheral phase angles and a larger plurality of views to be produced corresponding to preselected phase angles adjacent a central phase angle between the opposite peripheral phase angles;

averaging means for averaging the plurality of views corresponding to the same phase angle for at least the plurality of views having phase angles adjacent the central phase angle, whereby low frequency motion artifacts which are manifest in the central views are attenuated; and, transform means for transforming the averaged views and views encoded with phase encode angles adjacent the peripheral phase angles into an image representation for display on a man-readable display means.

12. An NMR imaging method comprising:

exciting a nuclear spin in a particular region of an object that is placed in a static field;

applying a phase-encoding gradient field of a predetermined intensity in a first direction for only a predetermined period of time;

measuring NMR signals from said object under the condition where a signal read-out gradient field is applied in a second direction;

repeating the procedures of said excitation, application of phase-encoding gradient field and measurement of signals, in such a manner that the intensity or time interval of said phase-encoding gradient field is changed, that the NMR signals are measured for each of a plural of a different phase-encoding amounts, and that the NMR signals are measured a plural number of times for a particular phase-encoding amount among said plurality of phase-encoding amounts;

averaging the values of time lapses of NMR signals measured for each of the phase-encoding amounts; and, subjecting the data of NMR signals inclusive of said averaged signals to the two-dimensional Fourier transfromation with the phase-encoding amount and the lapse of time as variables.

13. An NMR imaging method comprising:

exciting a nuclear spin in a particular region of an object that is placed in a static field;

applying a phase-encoding gradient field of a predetermined intensity in a first direction for only a predetermined period of time;

measuring NMR signals from said object under the condition where a signal read-out gradient field is applied in a second direction;

repeating the procedures of said excitation, application of phase-encoding gradient field and measurement of signals, in such a manner that the intensity or time interval of said phase-encoding gradient field is changed, that the NMR signals are measured for each of a plurality of different phase-encoding amounts, and that the NMR signals are measured for a particular phase-encoding amount amoung said plurality of phase-encoding amounts in a number of times greater than a number of times for other phase-encoding amounts;

averaging the values of time lapses of NMR signals measured for each of the phase-encoding amounts; and, subjecting the data of NMR signals inclusive of said averaged signals to the two-dimensional Fourier transformation with the phase-encoding amount and the lapse of time as variables.

14. An NMR imaging method according to claim 13, wherein the numbers of times of measurement repetition for each of the phase-encoding amounts are symmetrically distributed with the center value of phase-encoding amounts as a center.

15. An NMR imaging method according to claim 13, wherein the number of times of measurement repetition for the phase-encoding amounts increases toward the center value of the phase-encoding amounts.

* * * * *